United States Patent [19]

Wildes

[11] Patent Number: 5,319,583
[45] Date of Patent: Jun. 7, 1994

[54] DIGITAL COMPUTER SLIDING-WINDOW MINIMUM FILTER

[75] Inventor: Douglas G. Wildes, Ballston Lake, N.Y.

[73] Assignee: General Electric Company, Schenectady, N.Y.

[21] Appl. No.: 902,171

[22] Filed: Jun. 22, 1992

[51] Int. Cl.$^5$ .................... G06F 15/31; G06F 7/00
[52] U.S. Cl. ........................... 364/724.01; 364/715.06
[58] Field of Search ........................ 364/724.01, 715.06

[56] References Cited

U.S. PATENT DOCUMENTS

| | | | |
|---|---|---|---|
| 4,970,637 | 11/1990 | Sato | 364/715.06 |
| 5,122,979 | 6/1992 | Culverhouse | 364/715.06 |
| 5,144,568 | 9/1992 | Glover | 364/724.01 |

OTHER PUBLICATIONS

T. S. Huang, G. T. Yang, G. Y. Tang, "A Fast Two-Dimensional Median Filtering Algorithm," IEEE Trans. Acoustics, Speech, Signal Processing, vol. ASSP-27, pp. 13–18, Feb., 1979.

G. Garibotto and L. Lambarelli, "Fast On-Line Implementation of Two-Dimensional Medial Filtering," Electron. Lett., vol. 15, pp. 24–25, Jan. 1979.

*Primary Examiner*—David H. Malzahn
*Attorney, Agent, or Firm*—James Magee, Jr.

[57] ABSTRACT

The present invention comprises a buffer containing the signal values (digital data) currently within the sliding window, a list of data structures containing information about local minima and/or maxima within the buffer, and a method for updating the buffer and list as new signals are added to the window.

4 Claims, 6 Drawing Sheets

SIGNAL BUFFER FOR SLIDING WINDOW LENGTH N

HIST [0]   HIST [M]

HISTOGRAM FOR SIGNALS WITH $0 \leq$ VALUE $\leq M$

HIST [j] = NUMBER OF SIGNALS IN BUFFER [ ] WHICH HAVE VALUE j
    THEREFORE    HIST [MIN] > 0
        AND        HIST [j] = 0 FOR ALL j < MIN

DIGITAL COMPUTER SLIDING-WINDOW MINIMUM FILTER

FIELD OF THE INVENTIONS

The inventions relate to digital data processing and apparatus for determining minimum or maximum values found within a range of values through the use of a sliding-window minimum or maximum filter.

RELATED ART

Certain signal processing applications, such as removal of noise spikes from ultrasonic energy vibration signals, removal of unwanted noise in digital picture processing and speech analysis systems may use a sliding-window minimum or maximum filter. A sliding-window minimum or maximum filter with window length N converts a series of input data values into a series of output data values where each output value is the minimum (or maximum) of the current input value and the $N-1$ preceding input values. Such a sliding-window filter typically consists of: a digital data signal buffer which is large enough to hold signal values within the length of the desired window; data structures which contain information about the signal values present in the buffer and a means for updating both the signal values in the buffer and the associated data structures as the incoming signals continuously vary the contents of the buffer. The buffer may be implemented in a RAM (Random Access Memory) solid state integrated digital memory circuit, for example of 4096 bytes capacity. The length of the signal buffer, also termed the "window", may be varied over a range by a user depending upon the particular application. As the length of the signal buffer is increased, the amount of time and computing resources resources needed to process the increased information also increases.

In one approach taken by the prior art, a sliding-window minimum or maximum filter of length N (FIG. 1) produces, for each input signal, an output which is the minimum or maximum value of all the values within the signal buffer up to the most recent input signal value. Every time a new signal enters the signal buffer, the oldest value is deleted and it becomes necessary to recompute the output signal. A prior art method to find the minimum is shown in FIG. 2 using the signal buffer of FIG. 1.

In the method shown in FIG. 2, new signals are added to the signal buffer by first deleting the oldest value in the buffer thereby creating a less than full signal buffer. All the values in the buffer are then shifted serially to the left, thereby creating a void where a new signal can be added at the right so as to keep the buffer full, as shown in the shifting register buffer of FIG. 1. In FIG. 1, the newest signal is placed at the right in the Nth element of the signal buffer and is shifted toward the opposite end as new signals appear. This shift may be accomplished by copying each signal value in the buffer or by modifying pointers which identify the oldest and newest entries in the buffer. Recomputation of the minimum or maximum value in the signal buffer takes place after each addition of every new signal. Initialization of the filter FIG. 2 is accomplished by initially taking the oldest value in buffer [1] and defining it as being the "minimum". This arbitrarily labelled "minimum" is then compared to the signal value of each subsequent entry in the buffer until a lower value is found. Once a lower value is found, that value is redesignated the "minimum". Conversely, if a maximum filter is sought, the oldest value in buffer [1] [FIG. 1] is arbitrarily labeled the "maximum" which is thereafter compared to the signal value of each subsequent entry in the buffer until a higher value is found. The comparison continues until the last (newest) entry in buffer [n]is reached. Every time a new signal is added to the signal buffer the recomputation cycle begins again.

Since the value being designated as the "minimum" or "maximum" is necessarily compared to every value within the buffer after every new signal value is added to the buffer, the minimum time period required to update the "minimum" or "maximum" value is directly proportional to and dependent upon the length of the buffer, i.e. the number of entries in the buffer. Because buffers are often required to contain a great many signal values, the update time may be quite excessive. An update time is excessive when the length of time it takes to update the minimum or maximum value is longer than the time interval between new signals. When this happens, new signals appear faster than they can be processed and may therefore be lost.

It is therefore desired to decrease the update time to a minimum. An update time can also be excessive when, in a system that requires a reaction to a new minimum signal within a prescribed time limit, the length of the update time does not enable the system to react with in its required reaction time. Thus the prior art minimum or maximum filters of FIGS. 1 and 2 are not well suited for applications where short update times are of the essence, especially if the buffer length is needed to be large.

The update time of a minimum or maximum filter using linear searches can be decreased somewhat by apportioning more computing power and utilizing faster computing means. However, this increases the cost of the filter significantly while possibly resulting in relatively low gains in update time. In addition, sufficient compute power must be provided to handle all possible signal buffer lengths, even if the maximum possible window length occurs only rarely. This leads to an inefficient utilization of compute power and resources. Divorcing the update time from the window length would thus be advantageous and desirable.

An alternate prior art is shown in FIG. 3, which has a signal buffer and a histogram. The histogram holds the number of times a signal value appears for each value. The update process consists of searching the histogram to find the smallest value which occurs in the signal buffer. Although the search time is independent of the length of the signal buffer, it is proportional to the size of the histogram, e.g. for a 12-bit signal value the histogram contains 4096 cells. Thus, as greater resolution is desired (more values stored and compared) the histogram size will have to be increased, thereby proportionally increasing the search time. Minimum or maximum filters using histograms suffer from the same drawbacks as filters using linear searches. Whereas, in linear minimum or maximum filters the length of the signal buffer is the item of primary concern, in filters using histograms, the desired resolution of the signal values dictates the length of the update time. The higher the resolution desired, the longer the update time. To compensate for the longer update time associated with higher resolutions more computation power will be needed to both analyze and recognize the many possible signal values.

The search time of the above two methods may be improved by storing the signal or histogram values in a tree structure, see D. E. Knuth, *The Art of Computer Programming, Volume 3: Sorting and Searching,* §6.2 and §6.3, (Addison-Wesley, 1973) whereby the width of the tree equals the length of the signal buffer or the size of the histogram. The update time for a tree structure is proportional to the logarithm of the tree width. Use of a tree structure results in an overall decrease in search time, however search time is still dependent upon the length of the window. Tree structures can also be used to provide median information within their logarithmic run time.

Although the prior art teaches how to lessen the impact of having an update time dependent upon buffer length, it is desirable to provide a means of updating signal information independent of the size of the signal buffer or tree width. Doing so will allow a user greater predictability in the system's performance. In addition, an update time that is independent of the window length will allow the user to eliminate computational resources that would otherwise be needed for unusual worst case situations. This allows greater efficiency of the filter and minimizes the cost associated with filtering.

SUMMARY OF THE INVENTION

The present invention has solved the problem of dependent and varying update times. The invention performs updates of the sliding window with an average response time which is independent of both the length of the sliding window and the resolution of the data even for worst case input signals. Furthermore, by divorcing the average update time from the length of the signal buffer and the resolution of the data, the present invention advantageously enables the computational power required for analysis to be minimized by being used more efficiently. In addition, the constant average update time of the invention affords enhanced system performance predictability.

While the average update time is constant, the worst-case time required to update the filter output after the addition of a single new input value will depend on the length of the sliding window. When averaged over a number of input values which is a multiple of, or large compared to, the length of the sliding window, the filter update time becomes independent of the length of the sliding window.

The present invention comprises a buffer containing the signal values (digital data) currently within the sliding window, a list of data structures containing information about local minima and/or maxima within the buffer, and a method for updating the buffer and list as new signals are added to the window. The object of the list is to store information about local minima, or maxima, within the signal buffer thereby obviating the need for multiple searches through the same portions of the signal buffer or the list of structures.

BRIEF DESCRIPTION OF THE DRAWINGS

Other objectives, features and embodiments of the present invention are described in and will also be apparent from the following detailed description of the invention taken in conjunction with the accompanying drawings, wherein:

FIG. 5 shows the operation of the present invention when a new signal, which is less than the previous two minima, enters the signal buffer thereby causing the removal of one data structure from the list.

FIG. 6 shows the operation of the invention when a new signal which is greater than the previous max. is added to the signal buffer.

FIG. 7 shows the operation of the invention when a new signal, which is between the previous new min. and previous new max., enters the signal buffer thereby causing the addition of a new data structure to the list.

DETAILED DESCRIPTION OF THE INVENTION

Figure 1:
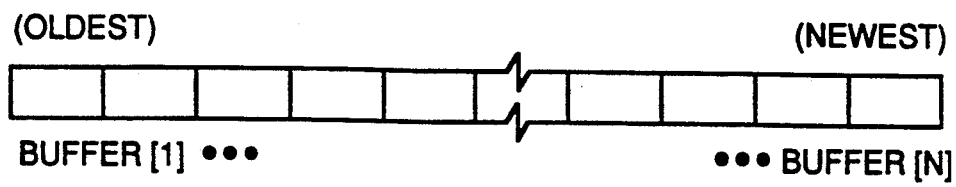
FIG. 1 shows a prior art signal buffer for a sliding window with a length of N.
Figure 2:
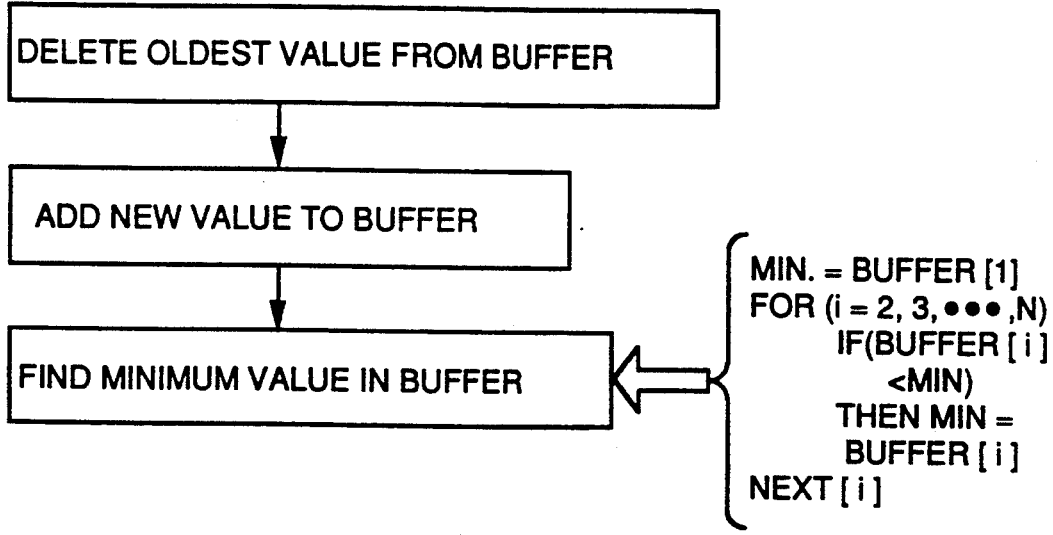
FIG. 2 shows a logical diagram of a prior art means of updating the signal buffer of FIG. 1 and performing a linear search for the minimum signal value within the signal buffer.
Figure 3:
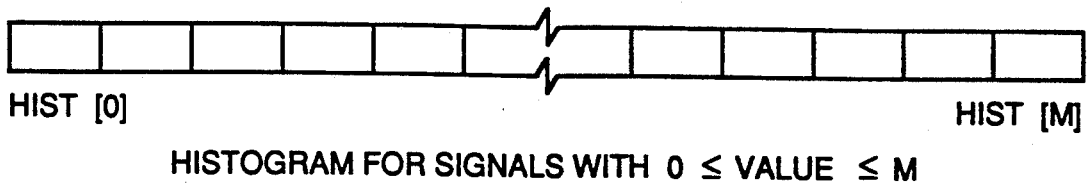
FIG. 3 shows a logical schematic of a prior art histogram system used in conjunction with the signal buffer of FIG. 1 and a conventional means to update the histogram and determine the minimum signal value contained in the histogram.
Figure 3:
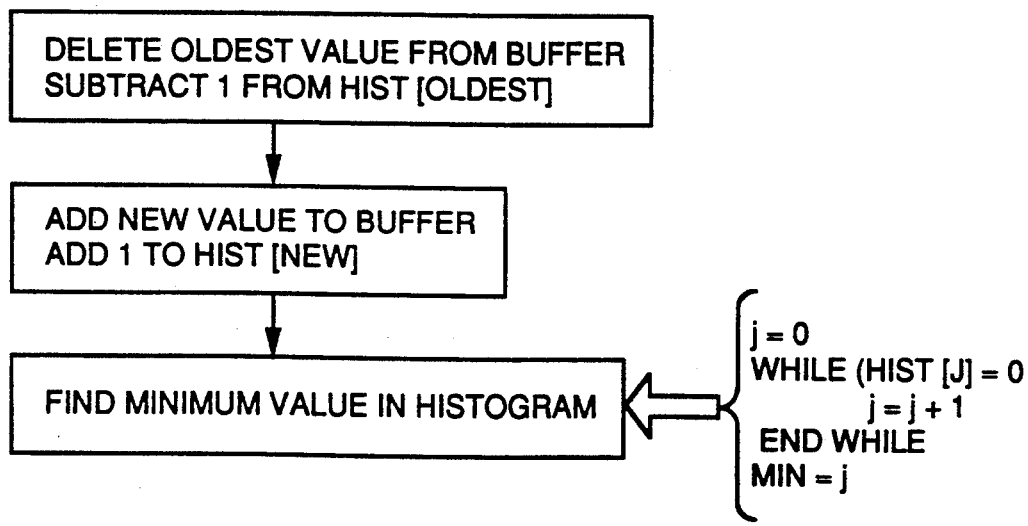

This invention concerns a process for the removal of unwanted noise from various types of signals. The invention finds application in digital signal processing applications which require the use of a sliding-window minimum or maximum filter, for example in digital image processing, digital speech processing and tool break detection systems. The filter extracts certain information (the local minimum or maximum) from the signal. This information may be used by other algorithms to further process the original signal, for example to adjust the dynamic range of an acoustic signal or to adjust the gray scale or color mapping of an image. As used herein, an extreme in data is a minimum or maximum in data and an extreme filter is one which provides a minimum or maximum of incoming signal values or data.

One specific example of a system which can use the present invention is the General Electric EDGE tool break detection system. This system uses a sliding-window filter to remove noise spikes from the ultrasonic energy vibration signal, prior to synchronously averaging the signal over several spindle revolutions.

The present invention has an average update time that is independent from both the length of the buffer used to store incoming signal values and the resolution of the stored data, thereby making the invention well suited for use in apparatus in which the buffer length or data resolution can vary widely. The "sliding window" means that the window of data upon which the filter's output depends is not fixed, but slides along the time axis as new data becomes available from the incoming signals.

Achieving an independent update time has enabled the invention to provide a constant average update time which is a surprising and highly desired advantage. Thus, the average update time is independent from both the signal buffer length and the resolution of the data. These advantages enable greater predictability of the system, and minimization of the computer power necessary to handle all possible signal patterns and buffer lengths, even for worst case combinations of these two variables.

The present invention achieves these highly desired advantages by maintaining a chronologically linked list of monotonically increasing local minima in the signal buffer for a minimum filter, or a list of monotonically decreasing the local maxima in the signal buffer for a maximum filter. As used herein, monotonic refers to data (local minima or maxima) which does not both increase and decrease over time within a given time interval such as the time interval corresponding to the buffer length. The signal buffer may be a single solid state RAM circuit of 4096 byte capacity.

The system of the present invention comprises a signal buffer containing the signal values currently within the sliding window. A chronologically linked list of data structures containing information about local minima or maxima within the signal buffer, and computing means for updating the signal buffer and list as new signals are added. The signal buffer is a digital memory, preferably a RAM (Random Access Memory) implemented in a VLSI (Very Large Scale Integrated solid state circuit). The buffer is part of a digital computer system, such as a PC, for example, or a SUN (TM) workstation. The list may be implemented in the same RAM chip (integrated circuit) as the signal buffer or may reside in a different RAM.

The invention permits the storing of sufficient information about the signal buffer, in the chronologically linked list of data structures, to obviate the need for multiple and redundant searches through the same portions of the signal buffer or the list of structures. When the buffer or list is searched, the data structures are reorganized so that information which was previously passed over is removed from the path of subsequent searches made in response to the addition of new signals.

Figure 4:
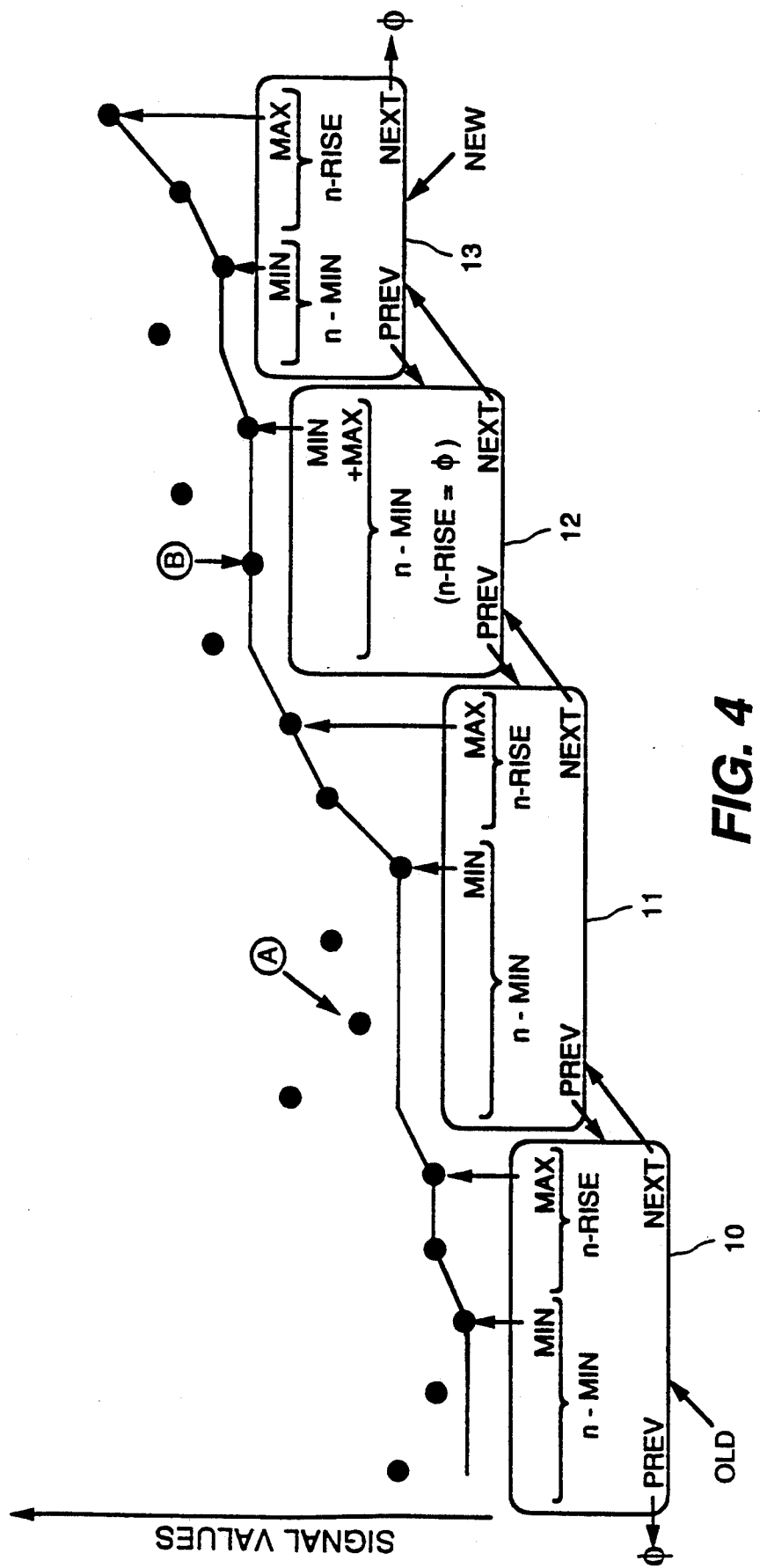
FIG. 4 shows the present invention by an example of a buffer containing signal values (large dots) and the list of data structures (rectangles) which are associated with those signal values. Each data structure contains two pointers (min., max.) into the signal buffer; two counters (n-min, n-rise) of the number of signal values associated with each pointer; and two pointers (prev., next) to previous and subsequent data structures in the doubly-linked list. The (min., max.) pointers and the (n-min, n-rise) counters are redundant. The invention would function equally well with pointers only or with counters only. Both are shown here for clarity and computational efficiency.

FIG. 4 illustrates the invention by depicting signal values (large dots) present in the signal buffer of FIG. 1, and the chronologically linked list of data structures (rectangles) associated with those values. Each data structure contains a minimum and maximum pointer that point into the signal buffer; n-min and n-rise counters that track the number of signal values associated with and prior to each pointer respectively; and previous (prev.) and next pointers to previous and subsequent data structures providing a doubly-linked chronological list of data structures. The n-min and n-rise counters, which may also be called n-min and n-rise counts, are not essential to the invention but are used in this example for purposes of clarity and computational efficiency.

The following operational description applies to a sliding-window minimum filter. One skilled in the art can modify the following to make it well suited as a sliding-window maximum filter for the particular function it is to serve.

The min. pointers of FIG. 4 are organized as a chronological, monotonic increasing list of the local minima. Local minima (A, B) which are succeeded by newer equal or lower minima, are not included in the list. Points within each data structure (rectangle), but between each min. pointer and the associated max. pointer are greater than the min. value, less than the next min. value, and are monotonic non-decreasing in value. If there are no values between the min. pointer and its associated max. pointer, the min. and max. pointers will then indicate the same value as shown in data structure 12.

The process for updating the signal buffer and data structures of the invention begins with the removal of the oldest signal value from both the signal buffer and the data structure which includes the oldest signal value. When this oldest signal value is the only value contained in a data structure, that data structure is removed from the linked list as well. A new signal value is then added to the signal buffer and the data structures are thereafter updated. The data structure update can occur in one of three ways. The choice of which one of the three ways it occurs depends upon the relative values of the new signal and the values of the signals already within the buffer.

Figure 5:
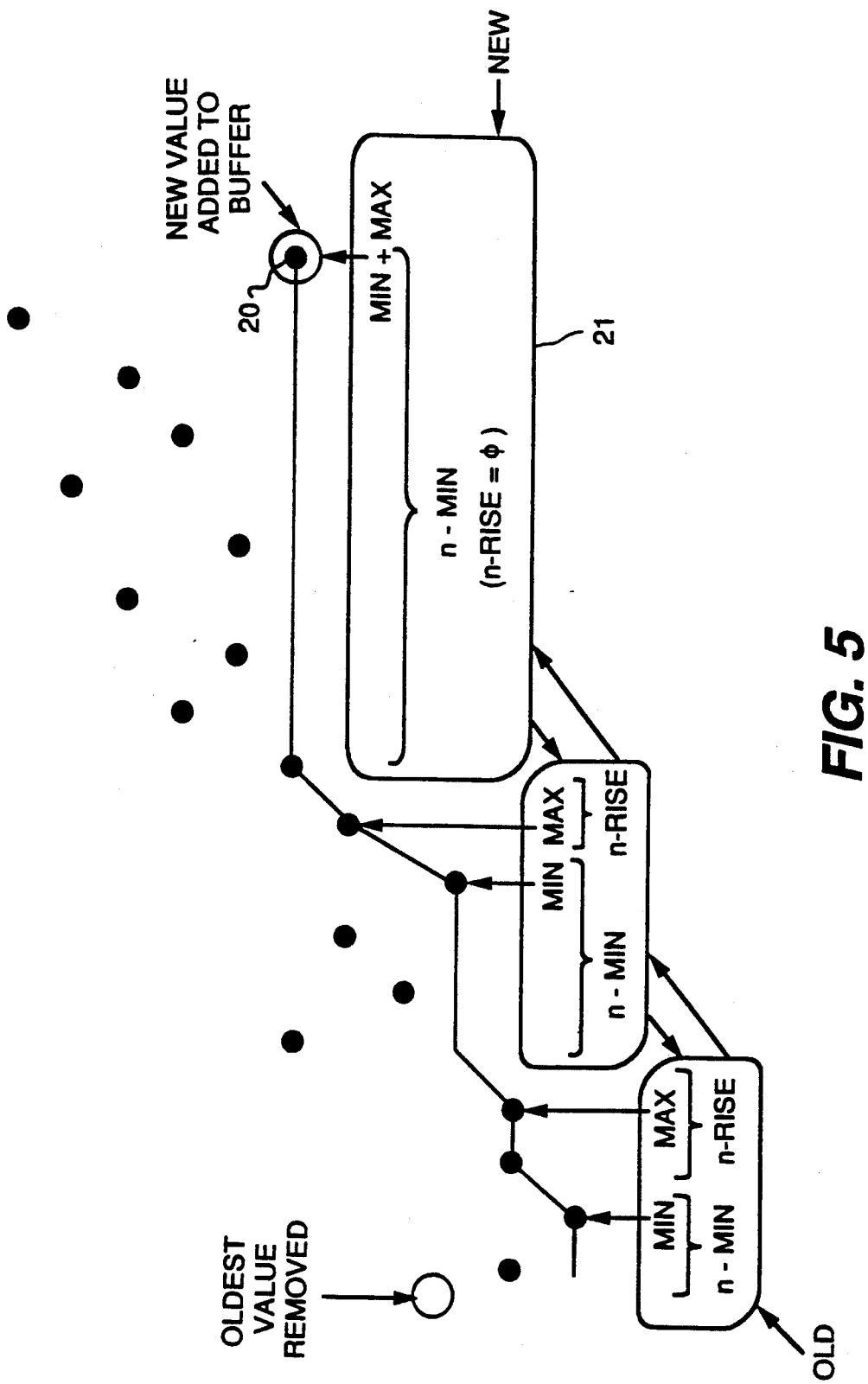
FIGS. 5, 6, and 7 show the signal buffer and data structures of FIG. 4, modified by the removal of the oldest signal value and the insertion of a new signal value.
Figure 6:
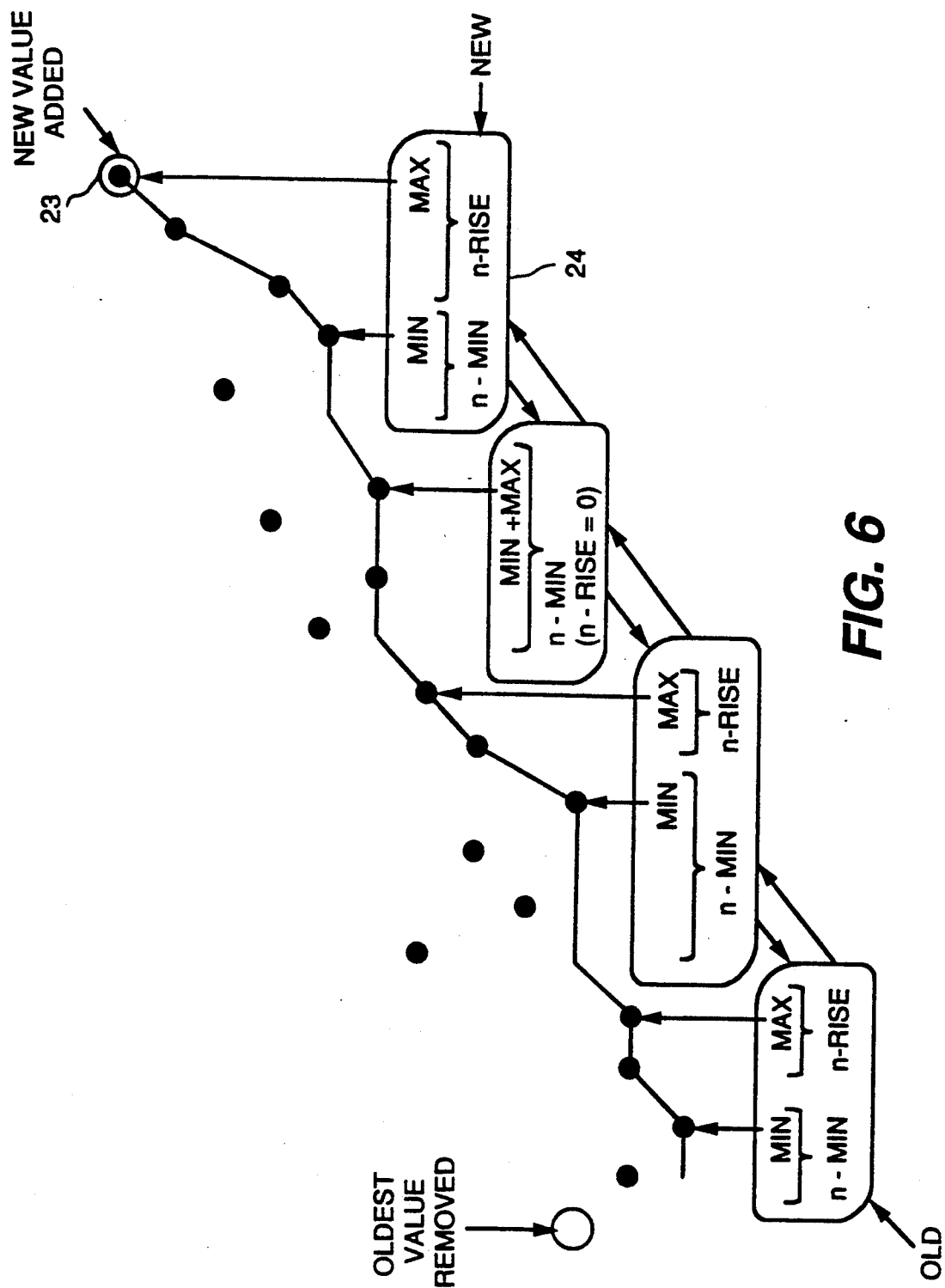
Figure 7:
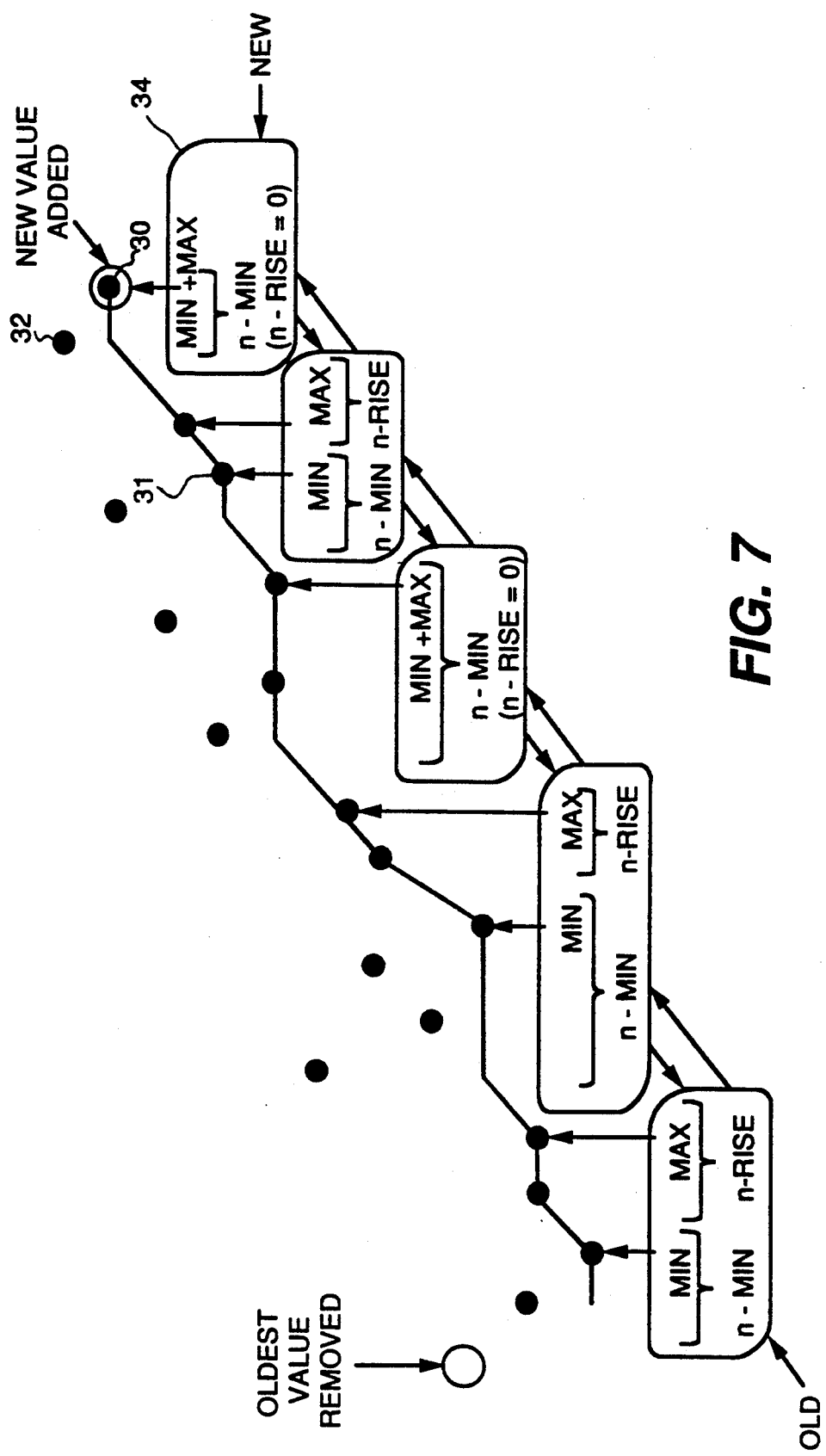

FIGS. 5, 6, and 7 show the signal buffer values and the list of data structures of FIG. 4 being updated in each of the three ways, all of which are used together.

First, if the new signal value 20 being added to the buffer (FIG. 5) is less than or equal to the previous newest min., the new signal value 20 becomes the new min. within the most recent chronological local data structure. A search is then made back through the list of data structures in reverse chronological order (starting with the newest and ending with the oldest). Any prior minima and associated data structures which are greater than or equal to the new min. are transferred into the new min.'s data structure 21 and removed from the list. The list of minima is monotonic increasing. The search back through the list ends as soon as a prior local minimum that is less than the new minimum is found. A second search compares the max. value of the prior structure to the min. value of the newest structure. All max. values that are greater than or equal to the min. value of the newest structure are transferred into the newest structure 21.

Secondly, if the new signal 23 is greater than or equal to the previous max., FIG. 6, the new signal becomes the new max. The max pointer of the newest data structure is shifted to point to the new signal value and the n-rise count of the newest data structure is increased by one. The n-rise count is a separate accounting which is optional. It also is a digital count maintained in RAM.

The third manner in which an update can occur is when the new signal 30 is greater than the previous min. 31 and less than the previous max. 32. In this case the new signal becomes a new local minimum. A new data structure 34 is added to the linked list corresponding to the new local minimum 30. A search is made comparing the previous max. value 32 to the new local min. 30. There will necessarily be at least one previous max value which is greater than the newest min. All such max. values which are greater than or equal to the new min. are transferred into the new data structure 34 (FIG. 7).

The program for this invention is as follows:

```
/*+
 * Module:      fast-min.c
 * Version:     1.6 9/20/90 18:25:24
 * Description:
 *   A sliding window minimum filter.  For each
 *   input, the filter output is the minimum of the
 *   current and nsamples-1 previous signal values.
 * Contents:
 *   INT8 *init_fast_min_filter (nsamples);
 *   signal_arg fast_min_filter (handle, signal);
 * Notes:
 *   This code deliberately contains no static
 *   variables.  All static data which must be
 *   preserved from one call to the next is kept in
 *   the filter_params struct, which is dynamically
 *   allocated in the init_min_filter() routine.
 *   This design allows multiple filters to share
 *   the same code.  Each instance of the filter has
 *   a unique filter_params struct.  A pointer to
 *   that struct is returned by init_min_filter(),
 *   and must be passed in each call to
 *   min_filter().
-*/
# include <stdio.h>
# include "config.h"     /* generic & system-
                            dependent declarations */
# include "filter.h"     /* signal typedefs and
                            function declarations */
# include "dbug.h"   /* Fred Fish DBUG macros */
# if defined DBUG_OFF
#   define _db_on_ 0
endif /*+ Data structures for the sliding window
    minimum filter */
/* A linked list of min_structs maintains a
   chronological, monotonically increasing list of
   the local minima in the sliding window */
```

```c
typedef struct min_struct
  {
  signal_t *min;      /* ptr to local min, in
                         data ring buffer */
  signal_t *max;      /* (min + n_rise) mod (size
                         of ring buffer) */
  int n_min;          /* no. of points before and
                         including *min, with
                         values >= *min */
  int n_rise;         /* no. of consecutive rising
                         values after *min and
                         less than *next->min */
  struct min_struct *prev; /* doubly-linked list */
  struct min_struct *next;
  } min_struct;

/* One filter_params struct is allocated for each
   instance of the min filter.  This holds all
   static variables (including pointers to the
   allocated data buffer and min_structs) necessary
   for the filter and allows the filter code to be
   shared and reentrant. */
typedef struct filter_params
  {
  int       nsamples;    /* length of tracking
                            window */
  signal_t *buffer;  /* ring buffer of nsamples
                        data values */
  signal_t *bufend;  /* last entry in buffer */
  signal_t *ptr;     /* oldest & next entry in
                        buffer */
  min_struct *old;   /* ptr to oldest
                        min_struct */
  min_struct *new;   /* ptr to newest
                        min_struct */
  min_struct *free_list; /* singly linked list of
                            free min_structs */
  } filter_params;
```

```
/* end of data structures
-*/

/* macros to increment or decrement any pointer
   to the data ring buffer */
# define INC(h, ptr)              \
   if (++(ptr) > (h)->bufend)     \
      (ptr) = (h)->buffer
# define DEC(h, ptr)              \
   if (--(ptr) < (h)->buffer)     \
      (ptr) = (h)->bufend /*+
 * Synopsis:  INT8 *init_fast_min_filter(nsamples);
 * Description:
 *    Allocate buffer space and initialize variables
 *    for sliding window minimum filter.
 * Inputs:
 *    int nsamples -- length of sliding window
 * Outputs:
 *    Returns pointer to structure containing
 *    filter parameters.
 * Side Effects:
 *    Allocates buffer space for data.  Allocates
 *    min_structs.  Initializes filter_params and
 *    min_structs to correspond to a data buffer full
 *    of zeroes.
 * Algorithm:
 *
 * Notes:
 *    Does not check return values from malloc()
 *    and calloc().
-*/
INT8 *
init_fast_min_filter (nsamples)
   int nsamples;              /* number of data samples
                  in tracking window */
{
```

```
char *malloc(), *calloc();
register filter_params *h;
int i, n_min_structs;
min_struct *p;
DBUG_ENTER ("init_fast_min_filter");
DBUG_PRINT ("args", ("nsamples = %d", nsamples));
h = (filter_params *) malloc(sizeof(filter_params));
h->nsamples = nsamples;
/* initialize to a buffer full of zeroes */
h->buffer = (signal_t *) calloc(nsamples,
                    sizeof(signal_t));
h->bufend = h->buffer + nsamples - 1;
/* should need half as many min_structs as samples.
   add one for spare */
n_min_structs = 1 + (nsamples + 1) / 2;
h->new = h->old =
   (min_struct *) calloc(n_min_structs,
              sizeof (min_struct));
/* put all min_structs but the first on the free
   list */
for (i = 0, p = h->free_list = h->new + 1;
     i < n_min_structs-2; i++, p = p->next)
  p->next = p + 1;
p->next = (min_struct *)NULL;
/* initialize filter_params and the first min_struct
   for a data buffer full of zeroes */
h->ptr = h->buffer;  /* ptr to oldest & next
                    entry in buffer */
h->new->min = h->new->max = h->bufend;
h->new->n_min = nsamples;
h->new->n_rise = 0;
h->new->next = h->new->prev = (min_struct *)NULL;
DBUG_PRINT ("return",
         ("handle = 0x%X, min_structs at 0x%X",
          (unsigned)h, (unsigned)h->new));
DBUG_RETURN ((INT8 *) h);
}
```

```
/*+
 * Synopsis:   signal_arg fast_min_filter(handle,
 *                          signal);
 * Description:
 *   A sliding window minimum filter.  For each
 *   input, the filter output is the minimum of the
 *   current and nsamples-1 previous signal values.
 * Inputs:
 *   INT8 *handle -- pointer to structure containing
 *      filter parameters.  Must have been previously
 *      set up by init_fast_min_filter().
 *   signal_arg signal -- the latest signal value.
 * Outputs:
 *   Returns minimum of current and nsamples-1
 *   previous signal values.
 * Side Effects:
 *   Updates contents of filter_params struct,
 *   pointed to by handle.
 *   Updates linked list of min_structs.
 * Algorithm:
 *   Maintains a chronological linked list of
 *   monotonically-increasing local minima.  If a
 *   new signal value is less than or equal to some
 *   minima in the current list, those minima are
 *   removed when the new signal is added.
 *   See comments and "Assertion" in code for
 *   greater detail.
 * Notes:
 *   The worst-case average performance of this
 *   algorithm is independent of the length of the
 *   sliding window.  Worst-case performance for one
 *   sample is linear in the window length, but the
 *   frequency with which this can occur varies
 *   inversely with the window length.
 *   In particular, this code contains only three
 *   loops.  Each pass through the body of a loop
 *   either deletes a min_struct from the linked
 *   list or decrements n_rise for one min_struct.
```

```
 *    The only time that a new min_struct is added or
 *    n_rise is incremented is when a new signal is
 *    added to the ring buffer.  Therefore the number
 *    of passes through the loops is limited to the
 *    number of signals added to the ring buffer.  An
 *    upper bound for the average execution time for
 *    this routine may be obtained by assuming that
 *    the body of each while() loop is executed once
 *    each time this routine is called.
-*/
signal_arg
fast_min_filter (handle, signal)
   INT8 *handle;            /* ptr to filter_params
                   structure */
   signal_arg signal;       /* latest signal value */
{
register filter_params *h; /* register copy of arg,
                   for speed */
DBUG_ENTER ("fast_min_filter");
DBUG_PRINT ("args",
         ("handle = 0x%X, signal = %g",
          (unsigned)handle, (double)signal));
/* convert handle to correct type and to a register
   variable for speed */
h = (filter_params *) handle;

/* remove oldest value from min_struct list */
if (h->old->n_min > 1)
   {
   /* oldest value precedes (and is >=) oldest
      minimum.  just delete it */
   h->old->n_min--;
   }
else if (h->old->n_rise > 0)
   {
   /* oldest value is oldest min, but one or more
      rising values fall between it and the
      next-oldest min.  advance the oldest min. */
```

```
      h->old->n_rise--;
      INC(h, h->old->min);
    }
  else
    {
    /* oldest value is oldest min, and is the only
       point in the oldest min_struct.  delete the
       oldest min_struct. */
    /* advance the 'oldest' pointer */
    h->old = h->old->next;
    /* add former oldest min_struct to free list */
    h->old->prev->next = h->free_list;
    h->free_list = h->old->prev;
    /* unlink it from the active min_struct list */
    h->old->prev = (min_struct *)NULL;
    }
  /* add new value to tracking window */
  *h->ptr = signal;     /* new overwrites old value
                           in data ring */
  /* add new signal to min_struct list */
  if (signal <= *(h->new->min))
    {
    /* the new signal is less than or equal to the
       newest local minimum.  the new signal becomes
       the 'min' of the newest min_struct and, if less
       than or equal to data in earlier min_structs,
       may absorb those data or min_structs into the
       newest min_struct. */
    register min_struct *p = h->new;
    /* shift min pointer of current min_struct to
       point to new signal */
    p->min = p->max = h->ptr;
    p->n_min += p->n_rise + 1;
    p->n_rise = 0;
    /* if the new min is less than previous minima,
       absorb those min_structs into the current
       min_struct */
    while ((p->prev) && (signal <= *(p->prev->min)))
```

```c
{
/* move data from p->prev into p */
p->n_min += p->prev->n_min + p->prev->n_rise;
/* add p->prev to the free list */
p->prev->next = h->free_list;
h->free_list = p->prev;
/* unlink p->prev from active min_struct list */
p->prev = p->prev->prev;
if (p->prev)      /* old struct was in */
  p->prev->next = p; /* middle of list */
else         /* old struct was oldest */
  h->old = p;    /* in list */
}
   /* move as many points as possible from the prev.
      n_rise list to the current n_min list */
   while ((p->prev) && (signal <= *(p->prev->max)))
     {
     p->n_min++;
     p->prev->n_rise--;
     DEC(h, p->prev->max);
     }
   }
 else if (*(h->new->max) <= signal)
   {
   /* the new signal continues a monotonic
      non-decreasing sequence which follows the
      newest local minimum. extend the n_rise count
      for the current min_struct. */
   INC(h, h->new->max);
   h->new->n_rise++;
   }
 else
   /* *(h->new->min) < signal < *(h->new->max) */
   {
   /* the new signal is a new local minimum, and not
      low enough to absorb the previous local min.
      create a new min_struct and absorb some rising
```

```
             data from the previous min_struct. */
  /* link the 1st free min_struct to the previous
     "new" min_struct */
  h->free_list->prev = h->new;
  h->new->next = h->free_list;
  /* reset the "new" and free ptrs to move the new
     min_struct from the free to the active lists */
  h->new = h->free_list;
  h->free_list = h->free_list->next;
  /* initialize the new "new" min_struct */
  h->new->next = NULL;
  h->new->n_min = 1;
  h->new->n_rise = 0;
  h->new->min = h->ptr;
  h->new->max = h->new->min;
  /* move as many points as possible from the prev.
     n_rise list to the current n_min list */
  while (signal <= *(h->new->prev->max))
    {
    h->new->n_min++;
    h->new->prev->n_rise--;
    DEC(h, h->new->prev->max);
    }
  }
```

/*+

New data has been added to the tracking window, ring buffer, and min_struct list. h->ptr has not yet been incremented, so it points to the newest data value in the ring buffer.

ASSERTION: The following properties hold:

For all (min_struct *)p such that h->old <= p <= h->new, and all (signal_t *)s such that h->buffer <= s <= h->bufend, 1) *p->min <= *p->max and *p->max < *p->next->min (linked list of minima is monotonic increasing)

2) if p->min < s <= h->ptr, then *p->min < *s (all data newer than *p->min are greater than *p->min)

3) if p->min - p->n_min < s < p->min, then
*p->min <= *s (the 'min' points are local minima)
4) if p->min < s1 < s2 <= p->max, then *p->min <
*s1 <= *s2 (points in the n_rise list (if any) are
greater than *p->min and monotonic non-decreasing)
5) if p != old, then p->n_min >= 2 (when a new
min_struct is created, it absorbs at least one
point from the previous min_struct's n_rise list)
6) nsamples == sum over all p of (p->n_min +
p->n_rise) (the min_structs cover the entire data
buffer)
Note that because the data buffer is a ring buffer
with a moving head, the above pointer comparisons
are chronological but not necessarily logical: s1
< s2 iff *s1 is older than *s2. If the oldest
point is at h->buffer and the newest at h->ptr ==
h->bufend, then the comparisons are both
chronological and logical.
-*/

```
/* print data ring and min struct list for
   diagnostics */
if (_db_on_)
  {
  signal_t *dp;
  min_struct *p;
  int i;
  /* print data ring */
  dp = h->ptr;
  INC(h, dp);        /* start with oldest */
  for (i = 0;  i < h->nsamples;  i++)
    {
    fprintf (stderr, "%4d ", (int)*dp);
    INC(h, dp);
    }
  fprintf (stderr, "\n");
  /* print list of min_structs */
```

```
    for (p = h->old; p != (min_struct *)NULL;
        p = p->next)
      fprintf (stderr, "\t%3d %4d  %3d %4d\n",
          p->n_min, (int)*p->min, p->n_rise,
          (int)*p->max);
  }
/* increment pointer to oldest & next signal */
  INC(h, h->ptr);
  DBUG_PRINT ("return",
          ("min = %g", (double)(*(h->old->min))));
  DBUG_RETURN (*(h->old->min));
}
/*+
 * Module:    filter.h
 * Version:   1.4 8/24/90 17:36:37
 * Description:
 *   Typedefs and function declarations for signal
 *   filters.
 * Contents:
 *   Signal typedefs (signal_t, signal_arg, sum_t)
 *   which allow filters to be written generically,
 *   then compiled for real or integer signals, on
 *   16- or 32-bit machines.  Extern declarations
 *   for initialization and filter routines for
 *   various types of filters (synchronous average,
 *   sliding minimum).
 * Dependencies:
 *   config.h  - INT8 typedef
 * Notes:
 *   The init_xx() routines return a pointer to an
 *   unspecified struct. With ANSI C, this should
 *   be (void *). In the EDGE project, we've used
 *   (INT8 *), but (char *) would probably be just
 *   as good.
-*/
# ifndef FILTERS_H_LOADED
#   define FILTERS_H_LOADED
```

```c
/* Use these types for data variables.  Algorithm
   code is then generic, and works equally well for
   floating point data (e.g. DADiSP or SPAG) and for
   integer data (EDGE). */
/* Use type "signal_t" for individual data values.
   Use "signal_arg" when passing a signal_t as a
   function argument. Use "sum_t" for large sums,
   which might exceed the range or resolution of
   a signal_t. */
# if 0
/* typedefs for floating-point signals and
   computations */
typedef float   signal_t;
typedef double  signal_arg;
typedef double  sum_t;
# endif
/* typedefs for integer signals and computations */
typedef short   signal_t;
typedef int     signal_arg;
typedef long    sum_t;

/* function declarations */
/* synchronous averaging */
INT8   *init_synch_ave();
signal_arg  synch_ave();
/* sliding minimum, linear search to update */
INT8   *init_linear_min_filter();
signal_arg  linear_min_filter();
/* sliding minimum,
   average update independent of filter window */
INT8   *init_fast_min_filter();
signal_arg  fast_min_filter();

# endif              /* FILTERS_H_LOADED */
```

What is claimed is:

1. A method providing a sliding window filter with an average response time that is independent of the length of the sliding window which comprises:
adding new signal values to a digital data buffer; and
generating data structures and a list of the data structures, each data structure having information pertaining to local extreme digital data within said buffer, said local extreme digital data corresponding to a plurality of local extremes of said digital signal values;
storing said list of data structures;
adding new signal values to the buffer; and
updating said buffer and said list as new signal values are further added to said buffer; and wherein said updating includes:
removing an oldest signal value from said buffer and from said data structure; and
adding a new signal to one of said data structures; and
wherein said local extremes include minimum signals and wherein:
said new signal is compared to a previous new minimum signal whereby the new signal becomes the new minimum if the new signal is less than or equal to the previous new minimum; and
a first search through the list of data structures whereby any minima greater than or equal to the new minimum are removed from said list; and
a second search where the maximum value of the next newest structure is compared to the minimum value of the newest structure whereby all maximum values greater than or equal to the new minimum are transferred into the new structure.

2. A method providing a sliding window filter with an average response time that is independent of the length of the sliding window which comprises:
adding new signal values to a digital data buffer; and
generating data structures and a list of the data structures, each data structure having information pertaining to local extreme digital data within said buffer, said local extreme digital data corresponding to a plurality of local extremes of said digital signal values;
storing said list of data structures;
adding new signal values to the buffer; and
updating said buffer and said list as new signal values are further added to said buffer; and wherein said updating includes:
removing an oldest signal value from said buffer and from said data structure; and
adding a new signal to one of said data structures; and
wherein said local extremes include maximum signals and wherein:
said new signal is compared to a previous new maximum signal whereby the new signal becomes the new maximum if the new signal is greater than or equal to the previous new maximum; and
a first search through the list of data structures whereby any maxima less than or equal to the new maximum are removed from said list; and
a second search where the minimum value of the next newest structure is compared to the maximum value of the newest structure whereby all minimum values greater than or equal to the new maximum are transferred into the new structure.

3. A method providing a sliding window filter with an average response time that is independent of the length of the sliding window which comprises:
adding new signal values to a digital data buffer; and
generating data structures and a list of the data structures, each data structure having information pertaining to local extreme digital data within said buffer, said local extreme digital data corresponding to a plurality of local extremes of said digital signal values;
storing said list of data structures;
adding new signal values to the buffer; and
updating said buffer and said list as new signal values are further added to said buffer; and wherein said updating includes:
removing an oldest signal value from said buffer and from said data structure;
adding a new signal to one of said data structures; and
wherein said local extremes include maximums and minimums and where the new signal is compared with a previous newest minimum and a previous newest maximum wherein:
if said new signal is less than or equal to the previous newest minimum the new signal becomes the new minimum, a first search is then conducted through the list of data structures during which all prior minima that are equal to or greater than the new minimum are removed from said list and absorbed into the new minimum structure and a second search through the list of data structures which transfers all maximum values of the next newest structure which are greater than or equal to the new minimum of the newest structure into the newest structure; and if said new signal is greater than or equal to the previous maximum, the new signal becomes the new maximum; and if the new signal is greater than the previous minimum and less than the previous maximum it becomes a new local minimum whereby a new structure is created and all maximum values of the previous structure which are greater than or equal to the new local minimum are transferred into said new structure.

4. A method providing a sliding window filer with an average response time that is independent of the length of the sliding window which comprises:

adding new signal values to a digital data buffer; and generating data structures and a list of the data structures, each data structure having information pertaining to local extreme digital data within said buffer, said local extreme digital data corresponding to a plurality of local extremes of said digital signal values;

storing said list of data structures;

adding new signal values to the buffer; and updating said buffer and said list as new signal values are further added to said buffer; and wherein said updating includes:

removing an oldest signal value from said buffer and from said data structure;

adding a new signal to one of said data structures; and wherein said local extremes include maximums and minimums and where the new signal is compared with a previous newest maximum and a previous newest minimum wherein:

if said new signal is greater than or equal to the previous newest maximum the new signal becomes the new maximum, a first search is then conducted through the list of data structures during which all prior maxima that are equal to or less than the new maximum are removed from said list and absorbed into the new maximum structure and a second search through the list of data structures which transfers all minimum values of the next newest structure which are greater than or equal to the new maximum of the newest structure into the newest structure; and if said new signal is greater than or equal to the previous minimum, the new signal becomes the new minimum; and if the new signal is less than the previous maximum and greater than the previous minimum it becomes a new local maximum whereby a new structure is created and all minimum values of the previous structure which are less than or equal to the new local maximum are transferred into said new structure.

* * * * *